US009954509B2

(12) United States Patent
    Park

(10) Patent No.: US 9,954,509 B2
(45) Date of Patent: Apr. 24, 2018

(54) EFFICIENCY VARIABLE ANTENNA

(71) Applicant: LG Innotek Co., Ltd., Seoul (KR)

(72) Inventor: Young Hun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 72 days.

(21) Appl. No.: 15/138,957

(22) Filed: Apr. 26, 2016

(65) Prior Publication Data
    US 2016/0315596 A1    Oct. 27, 2016

(30) Foreign Application Priority Data

Apr. 24, 2015    (KR) .................. 10-2015-0057864

(51) Int. Cl.
    *H01Q 1/48*    (2006.01)
    *H03H 7/38*    (2006.01)
    *H01Q 1/50*    (2006.01)
    *H01Q 9/42*    (2006.01)

(52) U.S. Cl.
    CPC ............... *H03H 7/38* (2013.01); *H01Q 1/50* (2013.01); *H01Q 9/42* (2013.01)

(58) Field of Classification Search
    CPC ............... H01Q 1/50; H01Q 1/48; H01Q 9/42
    See application file for complete search history.

(56) References Cited

U.S. PATENT DOCUMENTS

| | | | | |
|---|---|---|---|---|
| 8,217,841 | B2 * | 7/2012 | Hossain ................. | H01Q 1/243 343/700 MS |
| 2006/0097918 | A1 * | 5/2006 | Oshiyama ............. | H01Q 1/243 343/700 MS |
| 2014/0354508 | A1 * | 12/2014 | Lee ......................... | H01Q 1/48 343/860 |
| 2015/0054697 | A1 * | 2/2015 | Chen ....................... | H01Q 1/50 343/745 |

* cited by examiner

*Primary Examiner* — Hoang Nguyen
(74) *Attorney, Agent, or Firm* — Saliwanchik, Lloyd & Eisenschenk

(57) ABSTRACT

An efficiency variable antenna is provided, the efficiency variable antenna including: a feeding portion; a first grounding portion; a second grounding portion; a first switching element configured to turn on or off the feeding portion and the first grounding portion; and a second switching element configured to turn on or off the feeding portion and the second grounding portion.

3 Claims, 7 Drawing Sheets

EFFICIENCY VARIABLE ANTENNA

CROSS-REFERENCE TO RELATED APPLICATION

This application claims the benefit under 35 U.S.C. § 119 of Korean Application No. 10-2015-0057864 filed Apr. 24, 2015, which is hereby incorporated by reference in its entirety.

BACKGROUND OF THE DISCLOSURE

Technical Field

The present disclosure relates to an efficiency variable antenna.

Background

Generally, isolation between an antenna and a circuit is required to secure a range of −6~−15 dB, depending on the application. Recently, the isolation between a Wi-Fi antenna and a Bluetooth to an extent of −25 dB is required, due to introduction of a device that can simultaneously handle Wi-Fi and Bluetooth communications. An isolation below −30 dB is expected in near future.

However, when a device (for example, DTV, blue-ray device, etc.) is installed with an antenna, various and complicated peripheral reflectors make it difficult to secure an isolation, even if the isolation is secured by manual operation. In order to solve this problem, various techniques have been researched.

Generally, coexistence characteristic is measured to evaluate efficiency of an antenna. However, the conventional antenna and trimming method thereof consume a lot of time in measuring and improving the coexistence characteristic performance, which needs to be reduced

BRIEF SUMMARY

Technical Challenge

The present disclosure is to provide an efficiency variable antenna directed to solve the aforementioned problems or disadvantages, which can enhance transmission speed by actively optimizing the antenna efficiency and radiation pattern.

Technical Solution

In order to achieve at least the above objects, in whole or in part, and in accordance with the purposes of the present disclosure, as embodied and broadly described, and in a general aspect, there is provided an efficient variable antenna, the efficient variable antenna comprising: a feeding portion; a matching element including at least three inductors, for impedance matching of a current applied from the feeding portion; a first grounding portion and a second grounding portion connected to a first inductor and a second inductor included in the matching element; a first switching element configured to allow the first inductor connected to or disconnected from a circuit; and a second switching element configured to allow the second inductor connected to or disconnected from a circuit.

In some exemplary embodiments, the efficiency variable antenna may further comprise a first choke inductor and a second choke inductor configured to respectively supply an electric power to the first switching element and the second switching element.

In another general aspect, there is provided an efficiency variable antenna, the efficiency variable antenna comprising: a feeding portion; a first grounding portion; a second grounding portion; a first switching element configured to turn on or off the feeding portion and the first grounding portion; and a second switching element configured to turn on or off the feeding portion and the second grounding portion.

In some exemplary embodiment, the efficiency variable antenna may further comprise a first choke inductor and a second choke inductor configured to respectively supply an electric power to the first switching element and the second switching element.

In some exemplary embodiments, the efficiency variable antenna may further comprise: a first inductor arranged between the first grounding portion and the first switching element, and configured to perform impedance matching; a second inductor arranged between the second grounding portion and the second switching element, and configured to perform impedance matching; and a third inductor applied with electric power directly from the feeding portion.

Advantageous Effect

The efficiency variable antenna according to an exemplary embodiment of the present disclosure is advantageous in that the efficiency variable antenna can enhance transmission speed by actively optimizing antenna efficiency and radiation pattern when installed in a device. In addition, the efficiency variable antenna according to an exemplary embodiment of the present disclosure can be optimized without requiring any separate trimming, by being installed at the device.

DETAILED DESCRIPTION

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, the described aspect is intended to embrace all such alterations, modifications, variations, and equivalents that fall within the scope and novel idea of the present disclosure.

Hereinafter, the conventional measurement and improvement of coexistence characteristic will be described, and an exemplary embodiment of the present disclosure will be described in detail as well with reference to the enclosed drawings.

Figure 1:
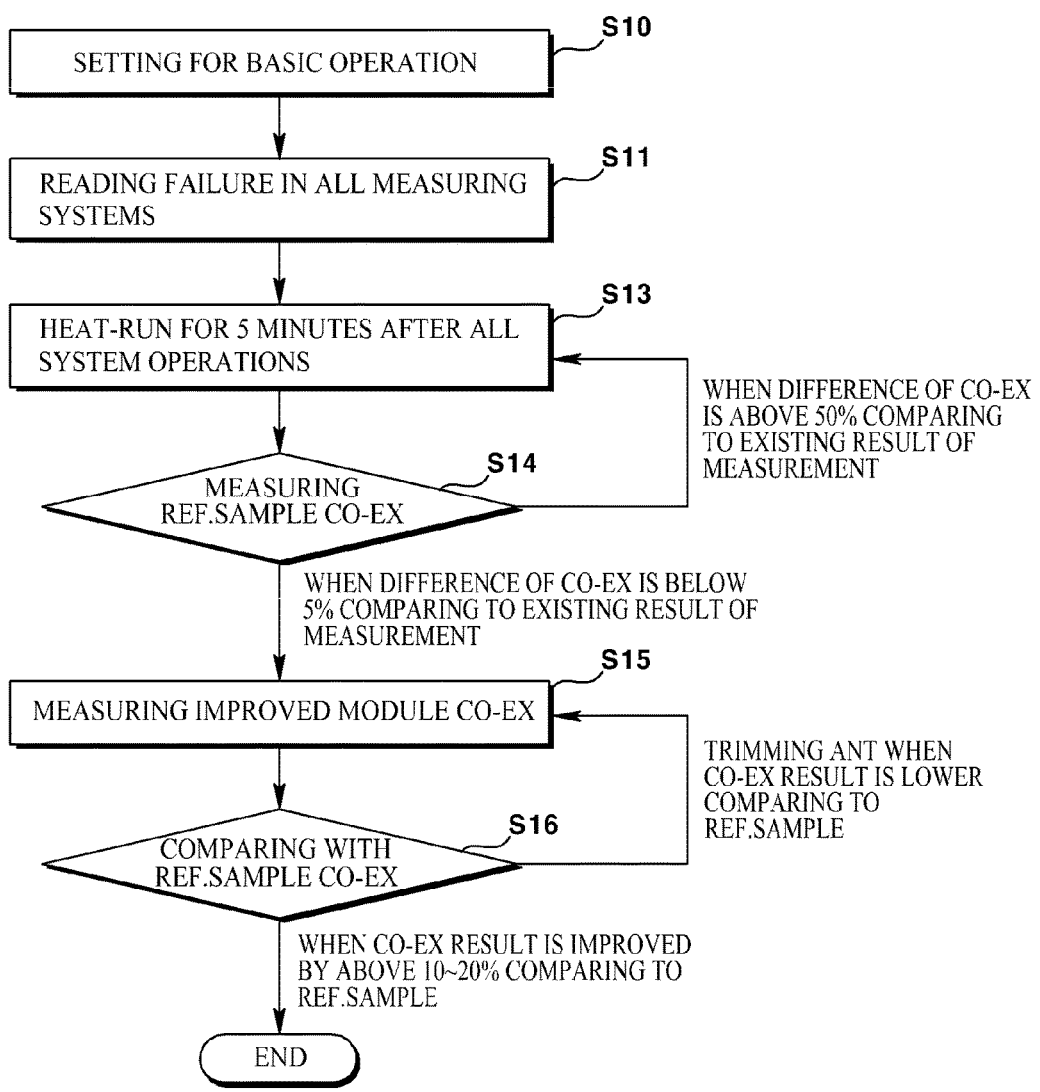
FIG. 1 is a flow chart describing a conventional process to measure and improve coexistence characteristic.
Figure 2:
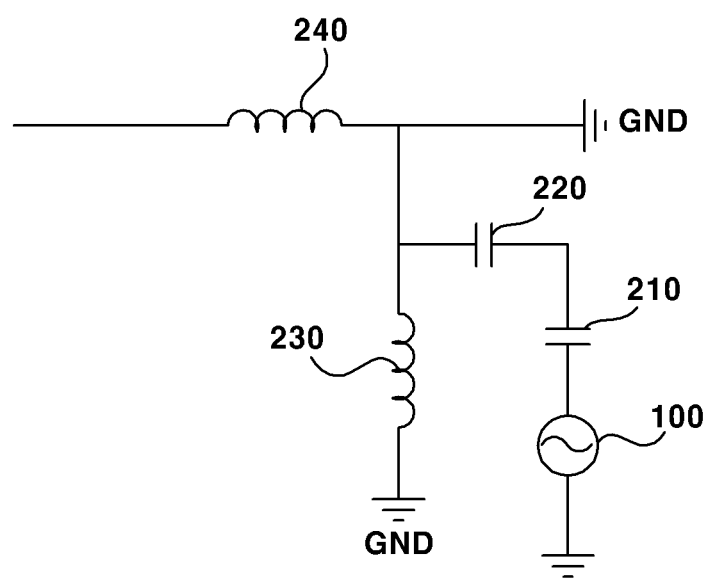
FIG. 2 illustrates an antenna trimmed by the process of FIG. 1.

FIG. 1 is a flow chart describing a conventional process to measure and improve coexistence characteristic, and FIG. 2 illustrates an antenna trimmed by the process of FIG. 1.

Referring to FIG. 1, the conventional process is to measure coexistence characteristic of a reference sample antenna and an improved sample antenna. If the result of the improved sample is lower comparing to the reference sample, the coexistence characteristic is improved through antenna trimming.

FIG. 2 illustrates an antenna used in the trimming process of FIG. 1. The antenna is composed of an antenna feeding portion (100), antenna matching elements (210~240), and two grounding portions (GND).

In this wise, according to the conventional process, the coexistence characteristic is improved by repetitive antenna trimming until the process end. Here, there is a problem in that a lot of time is consumed in the process of installing and removing a set.

Even if an excellent sample is obtained through the conventional process of FIG. 1, the whole process has to be repeated when firmware has been changed. In addition, substantial amount of time is consumed in trimming of each and every antenna. This also causes delay in development period.

The present disclosure is contrived to solve the foregoing problems or disadvantages of the conventional art. An efficient variable antenna according to an exemplary embodiment of the present disclosure can enhance transmission speed by actively optimizing antenna efficiency and radiation pattern when installed in a device, and can be optimized without requiring any separate trimming, by being installed at the device.

In addition, the efficiency variable antenna has excellent performance as a single independent unit, and can improve throughput performance as well by varying antenna efficiency to optimize coexistence characteristic, when installed at a device.

Moreover, the efficiency variable antenna can search the most excellent efficiency and radiation pattern by varying efficiency and radiation patterns, when installed at the device without having passed through a separate trimming process. Thereby, the development period can be reduced, and excellent performance can be implemented in various devices as well.

Figure 3:
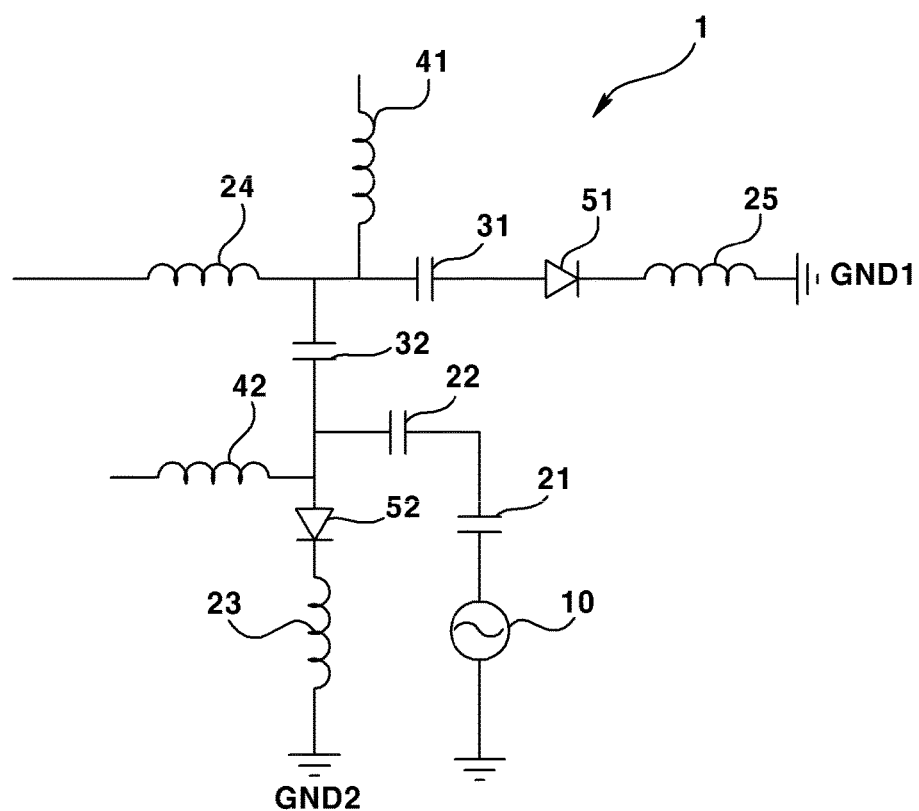
FIG. 3 is a circuit diagram schematically describing an efficiency variable antenna according to an exemplary embodiment of the present disclosure.

FIG. 3 is a circuit diagram schematically describing an efficiency variable antenna according to an exemplary embodiment of the present disclosure.

As illustrated in FIG. 3, the efficiency variable antenna according to an exemplary embodiment of the present disclosure may include an active circuit in addition to the conventional antennas as illustrated in FIG. 2. According to an exemplary embodiment of the present disclosure, the efficiency variable antenna (1) may include a feeding portion (10), antenna matching elements (21~25), first and second grounding portions (GND1, GND2), first and second DC blocking capacitors (31, 32), first and second RF choke inductors (41, 42), and first and second switching elements (51, 52).

An electrical signal induced to the feeding portion (10) may be radiated as wireless energy by the antenna (1) according to an exemplary embodiment of the present disclosure.

The matching elements (21~25) may determine resonance frequency of the antenna (1). The first and second and switching elements (51, 52) connected to the first and second grounding portions (GND1, GND2) may be respectively turned on or off to change grounding of the antenna (1). Thereby, radiation pattern and efficiency may be variable.

That is, the feeding portion (10) of the antenna (1) may compose a '+pole' of the antenna (1), and the grounding may compose a '-pole'. Here, entire efficiency of the antenna (1) may be varied depending on change in the grounding.

At this moment, the first and second switching elements (51, 52) may be diodes, for example, but not limited hereto. It is obvious to those skilled in the art that various RF elements that perform switching operations may be used.

Electric power of the first and second switching elements (51, 52) may be supplied from the first and second RF choke inductors (41, 42). Values that electrically block resonance frequency determined by the matching elements (21~25) may be used as inductance value of the first and second RF choke inductors (41, 42). That is, the inductor may have a unique Q-value depending on its size. According to an exemplary embodiment of the present disclosure, the resonance frequency may be blocked using such characteristic.

In addition, the first and second DC blocking capacitors (31, 32) may block electricity induced to a radiator, respectively.

Figure 4:
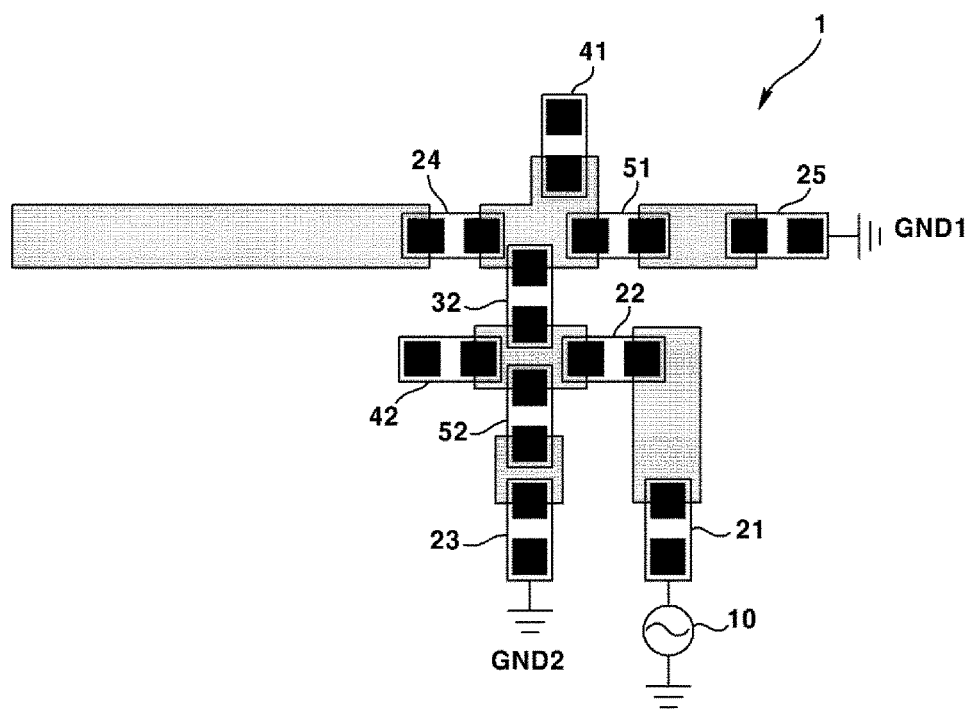
FIG. 4 illustrates an example where an efficiency variable antenna according to an exemplary embodiment of the present disclosure is printed on a PCB (Printed Circuit Board).

FIG. 4 illustrates an example where an efficiency variable antenna according to an exemplary embodiment of the present disclosure is printed on a PCB (Printed Circuit Board). However, this example is intended to be illustrative, and does not exclude modified implementation of the efficiency variable antenna according to an exemplary embodiment of the present disclosure.

Figure 5A:
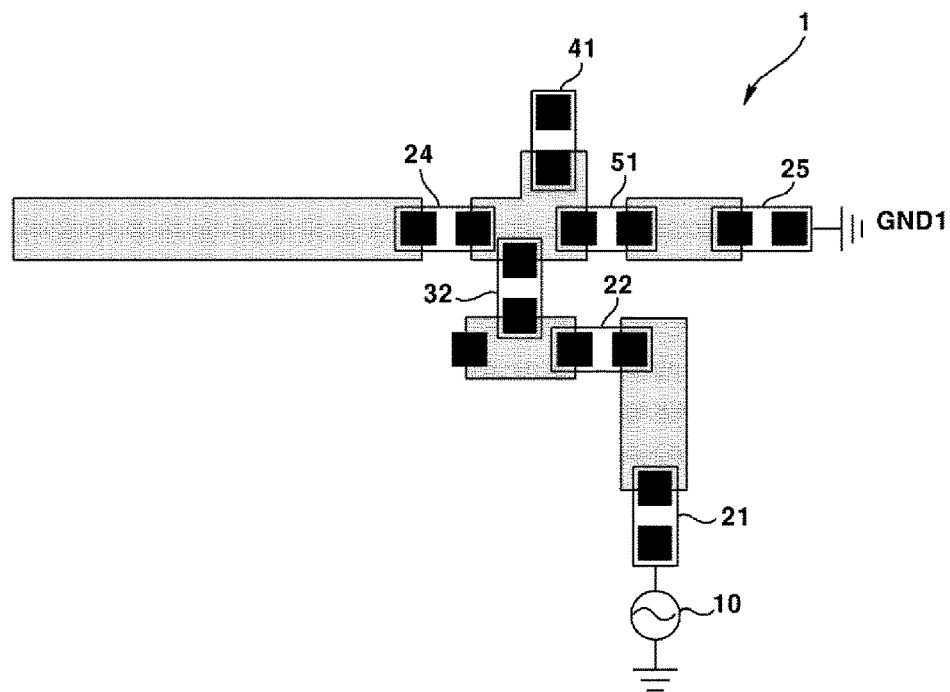
FIGS. 5a to 5c are exemplary views for describing an operational principle of an efficiency variable antenna according to an exemplary embodiment of the present disclosure.
Figure 5B:
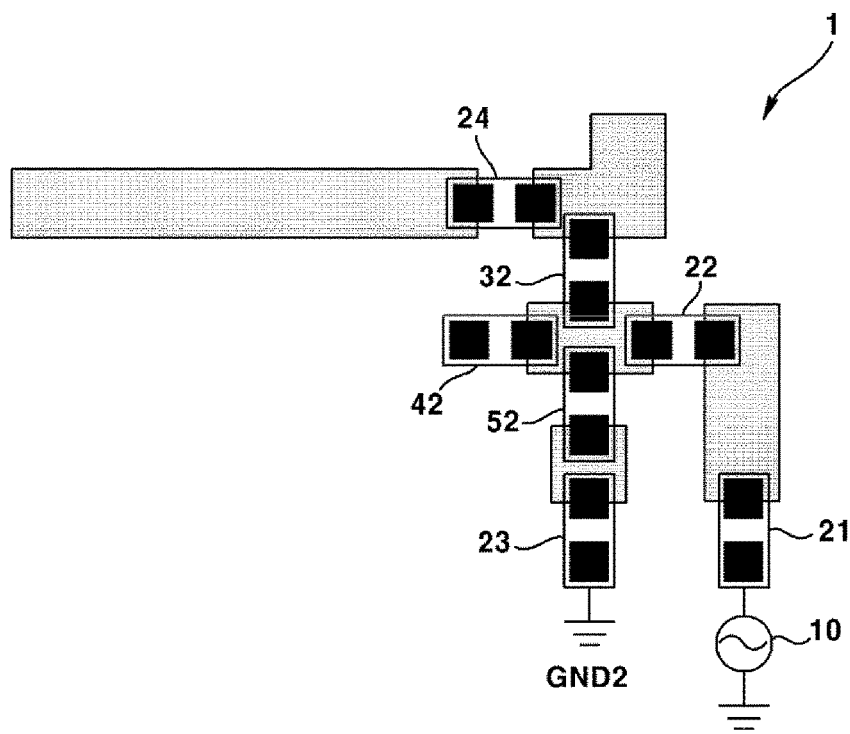
Figure 5C:
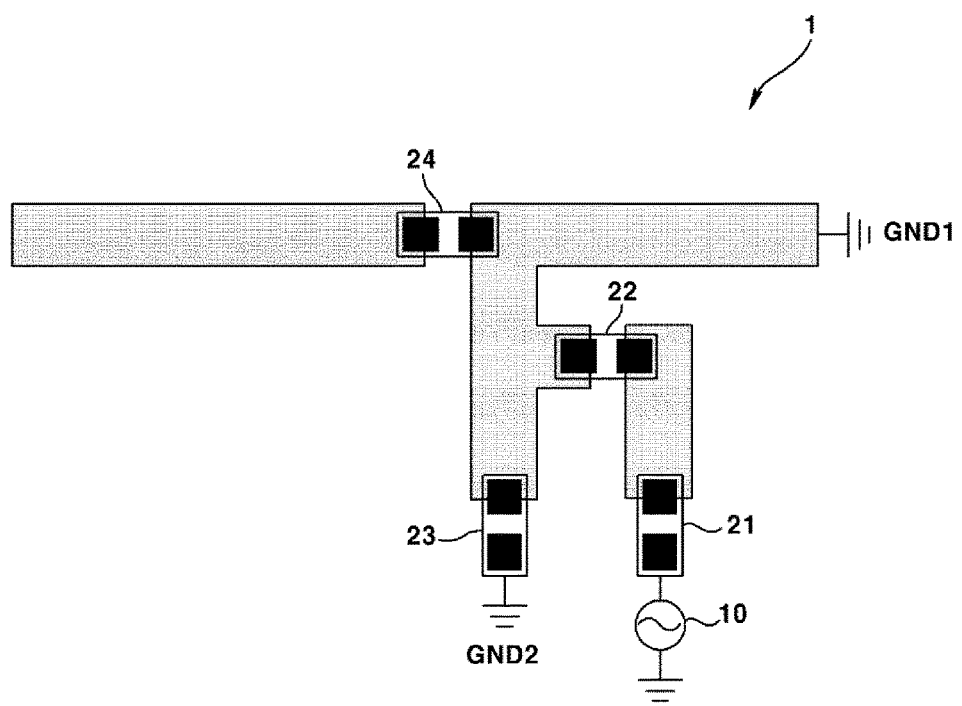

FIGS. 5a to 5c are exemplary views for describing an operational principle of an efficiency variable antenna according to an exemplary embodiment of the present disclosure.

That is, FIG. 5a illustrates an efficiency variable antenna according to an exemplary embodiment of the present disclosure, when the first switching element (51) is ON and the second switching element (52) is OFF. FIG. 5b illustrates an efficiency variable antenna according to an exemplary embodiment of the present disclosure, when the first switching element (51) is OFF and the second switching element (52) is ON. In addition, FIG. 5c illustrates an efficiency variable antenna according to an exemplary embodiment of the present disclosure, when both of the first and second switching elements (51, 52) are ON.

As illustrated in FIG. 5a, when the first switching element (51) is ON and the second switching element (52) is OFF, only the first grounding portion (GND1) is usable, such that radiation and efficiency of the antenna (1) may be variable.

In addition, as illustrated in FIG. 5b, when the first switching element (51) is OFF and the second switching element (52) is ON, only the second grounding portion (GND2) is usable, such that radiation and efficiency of the antenna (1) may be variable.

In addition, as illustrated in FIG. 5c, when both of the first and second switching elements (51, 52) is ON, both of the first and second grounding portions (GND1, GND2) are all usable, such that radiation and efficiency of the antenna (1) may be variable.

Here, efficiency of the antenna (1) may be impedance-matched depending on the structure of the grounding portions (GND1, GND2) in each case. However, difference in efficiency of the antenna (1) may be generated depending on the situation of the grounding portions (GND1, GND2).

In this wise, according to an exemplary embodiment of the present disclosure, efficiency of the antenna may be improved and isolation may be optimized, such that coexistence characteristic performance can be maximized. In addition, the antenna according to an exemplary embodiment of the present disclosure can be easily applied to various device, because trimming of the antenna according to firmware is not required any more.

In addition, isolation can be secured and optimized by varying a current direction of the antenna using the switching elements.

The following TABLE 1 and TABLE 2 respectively show efficiency and coexistence characteristic (co-ex) (TABLE 1) and isolation (TABLE 2) of the conventional antenna illustrated in FIG. 2. Here, the unit of isolation is [dB].

TABLE 1

| BAND | 2.4 GHz | 5 GHz |
|---|---|---|
| ANT0 | 33% | 58% |
| ANT1 | 58% | 56% |
| BT | 18% | |
| co-ex | 34 | |

TABLE 2

| BAND | 2.4 GHz | 2.5 GHz |
|---|---|---|
| ANT0-ANT1 | −23 | −23 |
| ANT0-BT | −27 | −28 |
| ANT1-BT | −27 | −28 |

In addition, the following TABLE 3 and TABLE 4 respectively show efficiency and coexistence characteristic (co-ex) (TABLE 3) and isolation (TABLE 4) of the antenna according to an exemplary embodiment of the present disclosure. Here, the unit of isolation is [dB].

TABLE 3

| | D1 ON | D2 ON | D1 ON | D2 OFF | D1 OFF | D2 ON |
|---|---|---|---|---|---|---|
| BAND | 2.4 GHz | 5 GHz | 2.4 GHz | 5 GHz | 2.4 GHz | 5 GHz |
| ANT0 | 33% | 58% | 33% | 58% | 33% | 58% |
| ANT1 | 58% | 56% | 58% | 56% | 58% | 56% |
| BT | 18% | | 40% | | 25% | |
| co-ex | 34 | | 47 | | 42 | |

TABLE 4

| | D1 ON | D2 ON | D1 ON | D2 OFF | D1 OFF | D2 ON |
|---|---|---|---|---|---|---|
| BAND | 2.4 GHz | 2.5 GHz | 2.4 GHz | 2.5 GHz | 2.4 GHz | 2.5 GHz |
| ANT0-ANT1 | −23 | | −23 | | −23 | |
| ANT0-BT | −27 | −28 | −26 | −28 | −27 | −29 |
| ANT1-BT | −27 | −28 | −29 | −32 | −32 | −41 |

As shown in the above TABLES, it can be ascertained that efficiency, coexistence characteristic, and isolation are all improved in the efficiency variable antenna according to an exemplary embodiment of the present disclosure.

The efficiency variable antenna according to an exemplary embodiment of the present disclosure can improve efficiency and optimize isolation to maximize coexistence characteristic, by varying grounds depending on ON/OFF of the switching elements, without requiring trimming process as illustrated in FIG. 1.

In addition, the efficiency variable antenna according to an exemplary embodiment of the present disclosure can be freely applicable to various devices, because it does not require trimming by changes in the devices to be installed with.

Thereby, performance of a Wi-Fi antenna can be optimized during BT operation or non-operation, respectively.

The abovementioned exemplary embodiments are intended to be illustrative, and not to limit the scope of the claims. Many alternatives, modifications, variations, and equivalents will be apparent to those skilled in the art. The features, structures, methods, and other characteristics of the exemplary embodiments described herein may be combined in various ways to obtain additional and/or alternative exemplary embodiments within an equivalent scope. Therefore, the technical scope of the rights for the present disclosure shall be decided by the appended claims and equivalents thereof.

What is claimed is:

1. An efficiency variable antenna, comprising:
   a feeding portion;
   a matching element including at least three inductors, for impedance matching of a current applied from the feeding portion;
   a first grounding portion and a second grounding portion connected to a first inductor and a second inductor included in the matching element;
   a first switching element configured to allow the first inductor connected to or disconnected from a circuit;
   a second switching element configured to allow the second inductor connected to or disconnected from the circuit; and
   a first choke inductor and a second choke inductor configured to respectively supply electric power to the first switching element and the second switching element.

2. An efficiency variable antenna, comprising:
   a feeding portion;
   a first grounding portion;
   a second grounding portion;
   a first switching element configured to turn on or off the feeding portion and the first grounding portion;
   a second switching element configured to turn on or off the feeding portion and the second grounding portion; and
   a first choke inductor and a second choke inductor configured to respectively supply electric power to the first switching element and the second switching element.

3. The efficiency variable antenna of claim 2, further comprising:
   a first inductor arranged between the first grounding portion and the first switching element, and configured to perform impedance matching;
   a second inductor arranged between the second grounding portion and the second switching element, and configured to perform impedance matching; and
   a third inductor applied with electric power directly from the feeding portion.

* * * * *